United States Patent
Standaert et al.

(10) Patent No.: US 10,008,449 B2
(45) Date of Patent: Jun. 26, 2018

(54) SELF-FORMING BARRIER FOR SUBTRACTIVE COPPER

(71) Applicant: INTERNATIONAL BUSINESS MACHINES CORPORATION, Armonk, NY (US)

(72) Inventors: Theodorus E. Standaert, Clifton Park, NY (US); Vamsi K. Paruchuri, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days. days.

(21) Appl. No.: 15/603,831

(22) Filed: May 24, 2017

(65) Prior Publication Data
US 2017/0256498 A1 Sep. 7, 2017

Related U.S. Application Data

(63) Continuation of application No. 15/153,110, filed on May 12, 2016, now Pat. No. 9,721,893, which is a
(Continued)

(51) Int. Cl.
*H01L 23/52* (2006.01)
*H01L 21/76* (2006.01)
(Continued)

(52) U.S. Cl.
CPC .. *H01L 23/53238* (2013.01); *H01L 21/02164* (2013.01); *H01L 21/288* (2013.01);
(Continued)

(58) Field of Classification Search
CPC ....... H01L 23/52; H01L 23/528; H01L 23/53; H01L 23/532; H01L 23/5323;
(Continued)

(56) References Cited

U.S. PATENT DOCUMENTS 6,057,230 A 5/2000 Liu
6,927,072 B2 8/2005 Molla et al.
(Continued)

OTHER PUBLICATIONS

Arita et al., Copper Metallization Technology for Deep Submicron ULSIs, 1994 MRS Fall Meeting, MRS Bulletin, Aug. 1994, pp. 68-74, Boston, MA.
(Continued)

*Primary Examiner* — Monica D Harrison
(74) *Attorney, Agent, or Firm* — Tutunjian & Bitetto, P.C.; Steven J. Meyers

(57) ABSTRACT

A method of forming electrically conductive structures that includes forming a copper containing layer including a barrier forming element, and applying a first anneal to the copper containing layer. The first anneal increases grain size of the copper in the copper containing layer. The copper containing layer is etched to provide a plurality of copper containing lines. A dielectric fill is deposited in the space between adjacent copper containing lines. A second anneal is applied to the plurality of copper containing lines. During the second anneal the barrier forming element diffuse to an interface between sidewalls of the copper containing lines and the dielectric fill to form a barrier layer along the sidewalls of the copper containing lines.

12 Claims, 3 Drawing Sheets

Related U.S. Application Data continuation of application No. 14/755,780, filed on Jun. 30, 2015, now Pat. No. 9,449,874.

(51) Int. Cl.

| | |
|---|---|
| *H01L 23/532* | (2006.01) |
| *H01L 21/768* | (2006.01) |
| *H01L 23/528* | (2006.01) |
| *H01L 21/288* | (2006.01) |
| *H01L 21/02* | (2006.01) |
| *H01L 21/3213* | (2006.01) |

(52) U.S. Cl.
CPC .... *H01L 21/2885* (2013.01); *H01L 21/32133* (2013.01); *H01L 21/7685* (2013.01); *H01L 21/76834* (2013.01); *H01L 21/76846* (2013.01); *H01L 21/76864* (2013.01); *H01L 21/76867* (2013.01); *H01L 21/76873* (2013.01); *H01L 21/76874* (2013.01); *H01L 21/76877* (2013.01); *H01L 21/76885* (2013.01); *H01L 21/76886* (2013.01); *H01L 23/528* (2013.01)

(58) Field of Classification Search
CPC ... H01L 23/53238; H01L 21/02; H01L 21/28; H01L 21/32; H01L 21/76; H01L 21/021; H01L 21/0216; H01L 21/02164; H01L 21/288; H01L 21/2885; H01L 21/321; H01L 21/3213; H01L 21/32133; H01L 21/768; H01L 21/7683; H01L 21/76834; H01L 21/7684; H01L 21/76846; H01L 21/7685; H01L 21/76867; H01L 21/76873; H01L 21/76874; H01L 21/76877; H01L 21/76885; H01L 21/76886
USPC ........................................................ 257/751
See application file for complete search history.

(56) References Cited

U.S. PATENT DOCUMENTS

| | | | |
|---|---|---|---|
| 7,064,076 B2 | 6/2006 | Kulkarni | |
| 7,507,659 B2 | 3/2009 | Ohtsuka et al. | |
| 7,846,833 B2* | 12/2010 | Kitada | H01L 23/53238 257/E21.584 |
| 7,955,971 B2* | 6/2011 | Yang | H01L 21/76846 257/751 |
| 7,994,055 B2 | 8/2011 | Sakai et al. | |
| 8,361,900 B2 | 1/2013 | Pan et al. | |
| 8,617,982 B2 | 12/2013 | Danek et al. | |
| 2010/0207177 A1 | 8/2010 | Liu et al. | |
| 2013/0062769 A1* | 3/2013 | Cabral, Jr. | H01L 23/53238 257/751 |
| 2013/0187273 A1 | 7/2013 | Zhang et al. | |
| 2015/0004784 A1* | 1/2015 | Yokoyama | H01L 21/76877 438/653 |
| 2015/0357236 A1* | 12/2015 | Edelstein | H01L 21/76846 257/751 |

OTHER PUBLICATIONS

Joseph et al., Advanced Plasma Etch for the 10nm node and Beyond, Proc. of SPIE, Feb. 24, 2013, vol. 8685, 86850A, San Jose, CA.

Koike et al., Cu Alloy Metallization for Self-Forming Barrier Process, 2006 International Interconnect Technology Conference, IEEE, Jun. 5-7, 2006, pp. 161-163, Burlingame, CA.

Markert et al., High throughput, high quality dry etching of copper/barrier film stacks, Microelectronic Engineering, Jan. 2000, pp. 417-423, vol. 50.

Miyazaki et al., Copper dry etching with precise wafer-temperature control using Cl2 gas as a single reactant, Journal of Vacuum Science & Technology, Mar. 1997, B 15, 237-240, vol. 15, No. 2.

Ohoka et al., Integration of Self-Formed Barrier Technology for 32nm-node Cu Dual-Damascene Interconnects with Hybrid Low-k (PAr/SiOC) Structure, 2006 Symposium on VLSI Technology Digest of Technical Papers, Jun. 2006, pp. 114-115, Honolulu, HI.

Usui, Highly Reliable Copper Dual-Damascene Interconnects With Self-Formed $MnSi_xO_y$ Barrier Layer, IEEE Transactions on Electron Devices, Oct. 2006, vol. 53, No. 10, pp. 2492-2499.

List of IBM Patents or Patent Applications Treated as Related dated May 24, 2017, 2 pages.

\* cited by examiner

SELF-FORMING BARRIER FOR SUBTRACTIVE COPPER

BACKGROUND

Technical Field

The present disclosure relates to copper containing structures for transmitting electrical current.

Description of the Related Art

As the technology node advances in semiconductor devices, RC delay is a major factor determining the performance of large scale integrated circuits. Use of copper (Cu) in integrated circuits reduces the line resistance, but an efficient barrier layer is preferred to prevent diffusion of copper (Cu) into the low-k dielectric typically used as a substrate and interlevel dielectric layer material.

SUMMARY

In one embodiment, a method of forming copper containing electrically conductive features is provided that includes a self-forming liner, e.g., self-forming barrier layer. In one embodiment, the method may include forming a copper containing layer including a barrier forming element. A first anneal is applied to the copper containing layer. The first anneal process increases the grain size of the copper in the copper containing layer. The copper containing layer is etched to provide a plurality of copper containing lines. A dielectric fill is deposited in a space between adjacent copper containing lines. A second anneal is applied to the plurality of copper containing lines During the second anneal, the barrier forming elements diffuse to an interface between sidewalls of the plurality of the copper containing lines and the dielectric fill to form a barrier layer along the sidewalls of the copper containing lines.

In another embodiment, the method of forming copper containing electrically conductive features may include forming at least one copper containing layer on a manganese (Mn) containing seed layer, and applying a first anneal to the at least one copper containing layer. The first anneal increases the grain size of the copper in the at least one copper containing layer. The at least one copper containing layer is etched to provide a plurality of copper containing lines. A dielectric fill is deposited in the space between adjacent copper containing lines. A second anneal is applied to the plurality of copper containing lines to diffuse manganese from the seed layer to an interface between sidewalls of the plurality of the copper containing lines and the dielectric fill to form a barrier layer along the sidewalls of the copper containing lines In another aspect of the present disclosure, an electrical device is provided including copper containing electrically conductive features that include the above described self-forming liner, e.g., self-forming barrier layer. The electrical device includes a dielectric layer; and at least one electrically conductive structure within the dielectric layer. The at least one electrically conductive structure includes a copper containing core and a barrier layer that includes manganese present on the sidewalls of the copper containing. In one embodiment, the barrier layer is continuous and uniform layer and has a lower surface coplanar with a lower surface of the copper containing core.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
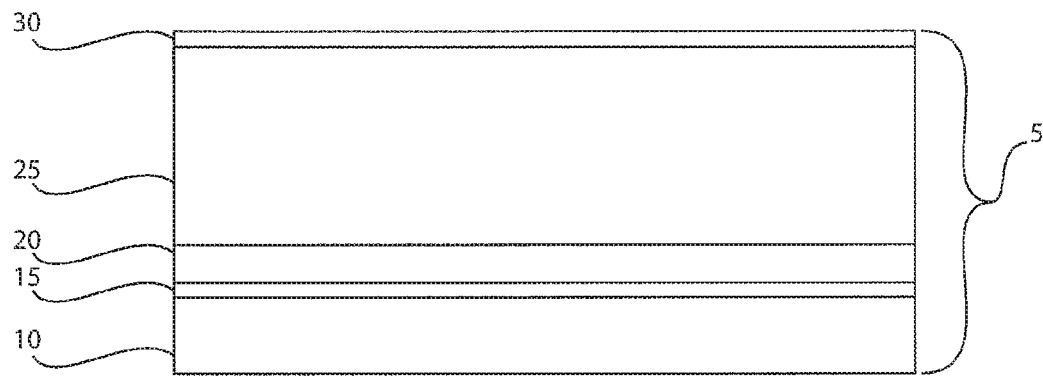
FIG. 1 is a side cross-sectional view depicting forming a layered stack of a first layer of barrier material on a substrate, a copper seed layer including a self-forming barrier layer element on the first layer of barrier material, a copper containing layer on the seed layer, and a second layer of barrier material on the copper containing layer, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "present on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein related to a self-forming barrier layer for copper containing structures that are formed using subtractive methods, which may be referred to as subtractive copper. Subtractive copper is one alternative to copper structures that are formed using damascene methods, i.e., damascene copper. In subtractive copper methods, large copper grain sizes can be obtained prior to subtractive etching. A "metal grain" is a small region of a metal, having a given and continuous crystal lattice orientation. Each grain can represent a small single crystal. It is believed that the large grain sizes provide for a higher electrical conductivity of copper structures, while fine grain sizes disadvantageously result in higher resistivity. The larger copper grain sizes can also improve electromigration lifetimes.

In accordance with some embodiments of the present disclosure, subtractive copper processing can allow for large grain sizes to be formed prior to the subtractive etching. One challenge to subtractive copper processing is the formation of liners, such as adhesion liners and diffusion barrier liners. As the copper sidewalls are exposed after etching, the interface between copper and a conventionally deposited liner is hard to control. For example, in the case of conventional copper damascene, the liner and the copper seed are deposited without air break. Another challenge when depositing a liner after a subtractive copper etch is that the liner is also deposited on the horizontal surface between the liners. Etchback of the liner in this case would be necessary to avoid shorting between the lines. This etchback may further compromise the integrity of the liner on the sidewalls. In some embodiments, the methods and structures that are disclosed herein provide for a self-forming barrier approach with liner formation. The self-forming barrier may be integrated into any conductive structure that transmits an electrical signal, e.g., electrical current, from one portion of a device to at least a second portion of the device that provides for transmitting an electrical signal, such as a metal line or interconnect.

The electrically conductive structures including the self-forming barrier layer may be employed in any electrical device. For example, the interconnect structures that are disclosed herein may be present within electrical devices that employ semiconductors, memory devices and passive electrical devices, as well as other electrically conductive structures, that are present within integrated circuit chips.

The methods and structures disclosed herein do not require complex etch schemes following liner formation; and can provide for a higher integrity liner/copper interface than what is possible with prior methods, which can provide for increased reliability. Some embodiments of the methods and structures disclosed herein are now described in more detail with reference to FIGS. 1-6.

FIG. 1 depicts forming a layered stack 5, which includes a first layer of barrier material 15 on a substrate 10. In some embodiments, the layered stack 5 further includes a seed layer including a barrier forming element 20, which can also be referred to as a manganese (Mn) containing seed layer 20, on the first layer of barrier material 15. A copper containing layer 25 may be present on the seed layer 20, and a second layer of barrier material 30 may be present on the copper containing layer 25.

The substrate 10 may be composed of any material that can contribute to supporting the material layers that are present in the layered stack 5. For example, the substrate 10 may be composed of a semiconductor material, e.g., type IV semiconductor material, such as silicon containing substrate, or a dielectric material, such as silicon oxide or a polymeric substrate. In some embodiments, the substrate 10 may be composed of a semiconductor material, and may include a plurality of microelectronic or smaller devices, such as semiconductor devices, e.g., field effect transistors (FET), fin type FETs (FinFETs), and/or memory devices. The devices that are housed on or within the substrate 10 may be in electrical communication with the later formed electrically conductive structures including the self-forming barrier layer.

In some embodiments, the first layer of barrier material 15 may be formed on the substrate 10. The first layer of barrier material 15 may function as a barrier to the diffusion of copper elements from the later formed seed and copper containing layers from diffusing into the substrate 10, and may function as a barrier for elements from the substrate, such as silicon and oxygen, diffusing into the copper containing layers that provide the electrically conductive structures. In other examples, the first layer of barrier material 15 can function as an adhesion layer for the later formed copper containing material layers, such as the seed layer 20 and the copper containing layer 25 that provide the electrically conductive structures.

The first layer of barrier material 15 may be composed of a metal nitride. For example, the metal nitride layer that provides the first layer of barrier material 15 may include a metal element selected from the group consisting of manganese (Mn), tantalum (Ta), aluminum (Al), cobalt (Co), ruthenium (Ru), tungsten (W) and combinations thereof. In some embodiments, the first layer of barrier material 15 may include tantalum nitride (TaN) or tungsten nitride (WN). In other embodiments, the first layer of barrier material 15 is composed of manganese nitride. Examples of manganese nitride include $Mn_4N$, $Mn_2N$, $Mn_3N$ and combinations thereof. In yet other embodiments, the first layer of the barrier material 15 may also be composed of an oxide. For example, a first layer of barrier material 15 that is composed of an oxide includes a metal element selected from the group consisting of manganese (Mn), tantalum (Ta), aluminum (Al), cobalt (Co), ruthenium (Ru) and combinations thereof. For example, when the first layer of the barrier material 15 is an oxide, the oxide may be provided by manganese oxide, such as manganese (II) oxide (MnO), manganese (II, III) oxide ($Mn_3O_4$), manganese (III) oxide ($Mn_2O_3$), manganese dioxide (manganese (IV) oxide) ($MnO_2$), manganese(VII) oxide ($Mn_2O_7$) and combinations thereof. In other embodiments, the first layer of the barrier material 15 may be composed of tantalum oxide, aluminum oxide, ruthenium oxide and combinations thereof.

The first layer of barrier material 15 may be deposited using chemical vapor deposition (CVD), atomic layer deposition (ALD), or physical vapor deposition (PVD).

Chemical vapor deposition (CVD) is a deposition process in which a deposited species is formed as a result of a chemical reaction between gaseous reactants at greater than room temperature, wherein solid product of the reaction is deposited on the surface on which a film, coating, or layer of the solid product is to be formed. Plasma enhanced chemical vapor deposition (PECVD) and metal organic chemical vapor deposition (MOCVD) are two examples of CVD processes that are suitable for forming the first layer of barrier material 15. "Atomic layer deposition" (ALD) as used herein refers to a vapor deposition process in which numerous consecutive deposition cycles are conducted in a deposition chamber. Typically, during each cycle a metal precursor is chemisorbed to the deposition surface; excess precursor is purged out; a subsequent precursor and/or reaction gas is introduced to react with the chemisorbed layer; and excess reaction gas (if used) and by-products are removed. "Chemisorption" and "chemisorbed" as used herein refer to the chemical adsorption of vaporized reactive precursor compounds on the deposition surface. The adsorbed species are bound to the deposition surface as a result of relatively strong binding forces characterized by high adsorption energies (>30 kcal/mol), comparable in strength to ordinary chemical bonds. The chemisorbed species can be limited to the formation of a monolayer on the deposition surface with atomic layer deposition processes.

Examples of physical vapor deposition (PVD) suitable for depositing the first layer of barrier material 15 include plating, electroplating, electrophoretic deposition, electroless deposition, sputtering, and combinations thereof. The first layer of barrier material 15 may be deposited to a thickness ranging from a few monolayers to 150 Å. In other embodiments, the first layer of barrier material 15 may have a thickness ranging from 3 Å to 75 Å.

The seed layer including the barrier forming element 20, e.g., a manganese (Mn) containing seed layer 20, is formed on the first layer of barrier material 15. A "seed layer" helps nucleation of a later formed metal layer, such as the later formed, e.g., electroplated, copper containing layer 25. For example, direct electroplating on smooth, low-roughness, or hydrophobic surfaces of glass, semiconductor, or ceramic substrates is difficult because the target surface has low surface energy or poor wettability, which leads to a relatively high excess energy for electroplating nucleation. As a consequence, scattered and irregular grains of metal grow on a small number of nucleation sites, causing poor interfacial adhesion and large surface roughness. A further consequence of the scattered and irregular grain formation is that strain energy, which is caused by a different atomic arrangement between two adjacent metallization layers, increases with increasing overall metallization thickness, and can sometimes cause metallization layers to spontaneously peel off. The deposition of a thin layer seed layer can reduce the aforementioned phenomena. For example, the seed layer may provide an electrically uniform surface as a deposition surface for an electroplated copper layer, i.e., copper containing layer. In some embodiments, the seed layer 20 is composed of at least copper as the base material of the seed layer including the barrier forming element 20.

The term "barrier forming element" denotes that the seed layer 20 includes at least one element that can react with other elements, such as dielectric and semiconductor type elements, to form a diffusion barrier to at least one of the outdiffusion of copper and/or the diffusion of elements into a copper containing layer. In some embodiments, the barrier forming element is a metal that reacts with at least oxygen to form an oxide. In one embodiment, the barrier forming element is present in the seed layer in an amount ranging from 0.5 at. % to 60 at/%. In another embodiment, the barrier forming element that is present in the seed layer in an amount ranging from 2 at. % to 20 at. %.

In some embodiments, the barrier forming element includes manganese (Mn) that is alloyed with copper (Cu) in the seed layer 20. For example, a seed layer including a barrier forming element may be a copper manganese (CuMn) seed layer. In one embodiment, a seed layer including a barrier forming element composed of an alloy of copper (Cu) and manganese (Mn) may include copper in an amount ranging from 0.5 at. % to 60 at. % and copper (Cu) and manganese (Mn) in an amount ranging from 2 at. % to 20 at. %. Other examples of seed layers including a barrier forming element 20 that may be suitable for use with the present disclosure may include CuAl, CuGe, CuMg, CuNi, CuTi or a combination thereof. It is noted that the above examples are provided for illustrative purposes only, and are not intended to limit the present disclosure to only the examples provided above. For example, a copper alloy for the seed layer 20 may further includes a transition metal from Group IVB, VB, VIB, VIIB or VIII of the Periodic Table of Elements or a metal from Group IIIA of the Periodic Table of Elements. Examples of further alloying elements for the seed layer 20 may include Ir, Pt, Co, Ru, and Rh.

In some embodiments, the seed layer including a barrier forming element 20 may be deposited using chemical vapor deposition (CVD), atomic layer deposition (ALD), physical vapor deposition (PVD) or a combination thereof. In one example, in which the seed layer including the barrier forming element 20 is composed of CuMn, the seed layer may be deposited using ALD. The seed layer including the barrier forming element 20 may be deposited to a thickness ranging from 100 Å to 1000 Å. In some embodiments, the thickness of the seed layer including the barrier forming element 20 may range from 10 Å to 300 Å. In one example, the thickness of the seed layer including the barrier forming element may be on the order of 60 Å.

Still referring to FIG. 1, the copper containing layer 25 may then be formed on the seed layer including the barrier forming element 20. The copper containing layer 25 is typically formed using a physical vapor deposition (PVD) process, such as a copper plating process. For example, the copper containing layer 25 may be deposited using plating, such as electroplating or electroless plating, as well as sputtering. Plating is a method of depositing a layer of metal on a deposition surface. Electroplating is a process that uses electrical current to control the flow of charged particles, such as metal cations and anions, so that they form a coherent metal coating the deposition surface, e.g., the seed layer including the barrier forming elements 20. One example of a plating bath composition that is suitable for forming a copper containing layer 25 by electroplating may include a copper sulfate ($CuSO_4$) solution with sulfuric acid ($H_2SO_4$). In some embodiments, electroless deposition of copper (Cu) may rely on the presence of a reducing agent, for example formaldehyde (HCHO), which reacts with the copper (Cu) metal ions to deposit the metal. Sputtering is another example of a PVD process that can form the copper containing layer 25. The copper containing layer 25 may also be formed using chemical vapor deposition (CVD).

In one embodiment, the copper including material for the copper containing layer 25 is a pure copper, i.e., 100 at. % copper. The pure copper may include incidental oxidation of the copper. In another embodiment, the copper including material is a mixture of copper and one or more other metals. A copper-metal mixture can be a heterogeneous mixture, or alternatively, a homogeneous mixture, such as an alloy. Some alloys of copper include copper-tantalum, copper-manganese, copper-aluminum, copper-titanium, copper-platinum, copper-zinc, copper-nickel, and copper-silver alloys. Generally, the alloys considered herein contain copper in an amount of at least 40% by weight of the alloy, and more generally, at least 50%, 60%, 70%, 80%, 90%, 95%, 97%, 98%, or 99% by weight of the alloy. It is noted that any composition including copper may be employed for the copper including layer 25, so long as the composition is electrically conductive. "Electrically conductive" as used through the present disclosure means a material typically having a room temperature conductivity of greater than $10^{-8}$ $(\Omega\text{-m})^{-1}$.

In one embodiment, the electroplated copper may have a grain size ranging from 50 nm to 1250 nm depending upon the thickness of the electroplated copper containing layer 25. In another embodiment, the grain size of electroplated copper may range from 100 nm 1000 nm. For example, electroplated copper may have a grain size of 125 nm, 150 nm, 200 nm, 250 nm, 300 nm, 350 nm, 400 nm, 450 nm, 500 nm, 550 nm, 600 nm, 650 nm, 700 nm, 750 nm, 800 nm, 850 nm, 900 nm, and 950 nm, as well as being within a range having an upper value and a lower value provided by aforementioned grain size examples.

In some embodiments, the copper containing layer 25 has a thickness ranging from 10 nm to 15 microns. In another embodiment, the copper containing layer 25 has a thickness ranging from 5 microns to 10 microns.

The second layer of barrier material 30 that is present atop the copper containing layer 25 is similar to the first layer of barrier material 15. Therefore, the description of the first layer of barrier material, including its composition, method of forming and thickness is suitable for the description of the second layer of barrier material. The first and second layers of barrier material 15, 30 may have the same or different compositions. In some embodiments, the first and second layers of barrier material 15, 30 having substantially the same composition and geometry, i.e., the first and second layers of barrier material 15, 30 are symmetrical.

Figure 2:
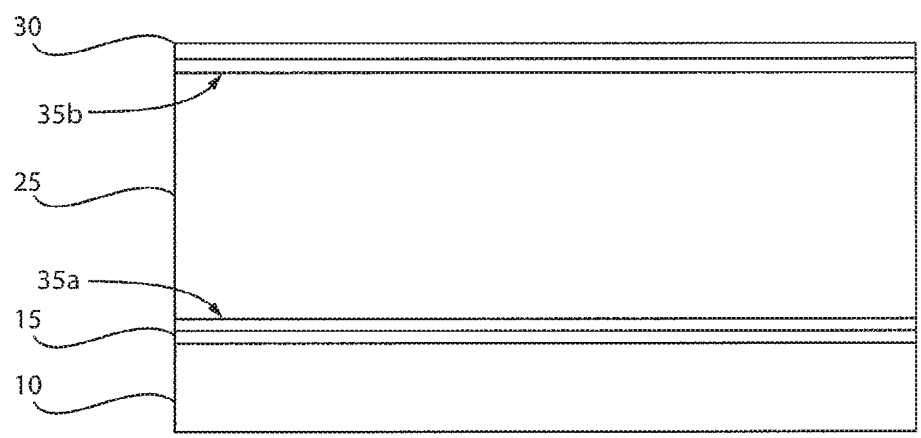
FIG. 2 is a side cross-sectional view depicting applying a first anneal to the structure depicted in FIG. 1 to increase the grain size of the copper containing layer, in accordance with one embodiment of the present disclosure.

FIG. 2 depicts applying a first anneal to the structure depicted in FIG. 1. The first anneal can increase the grain size of the copper containing material, e.g., copper or copper alloy, within the copper containing layer 25. The first anneal can also cause the barrier forming element from the seed layer 20 diffusing to the upper and lower surfaces of the copper containing layers, e.g., the copper containing layer 25. In one embodiment, the first anneal may include a temperature that can range from 50° C. to 500° C. In another embodiment, the first anneal may include a temperature that can range from 100° C. to 300° C. The time period of the anneal process may range from 1 second to 4 hours. In one example, the anneal process may be for a time period ranging from 10 minutes to 120 minutes. Any annealing apparatus can be used for the first anneal process, such as furnace annealing and rapid thermal annealing (RTA). In one example, the first anneal may be performed in an inert ambient including He, Ar, Ne, Xe, Kr and mixtures thereof. Nitrogen can also be used as an inert ambient alone or in admixture with one of the inert ambients previously mentioned.

In some embodiments, the grain size of the copper (Cu) in the copper containing layer may increase during the first anneal from its original grain size following formation of the copper-containing layer, e.g., by electroplating, to a grain size ranging from 375 nm to 3250 nm, which can depend upon the original grain size of the copper (Cu). In one embodiment, the grain size of the copper (Cu) in the copper containing layer may increase during the first anneal to a grain size ranging from 350 nm to 3000 nm. For example, the grain size of the copper (Cu) following the first anneal may be equal to 350 nm, 400 nm, 500 nm, 600 nm, 700 nm, 800 nm, 900 nm, 1000 nm, 1250 nm, 1500 nm, 1750 nm, 2000 nm, 2100 nm, 2200 nm, 2300 nm, 2400 nm, 2500 nm, 2600 nm, 2700 nm, 2800 nm, and 2850 nm, as well as being within a range having an upper value and a lower value provided by aforementioned grain size examples.

In some embodiments, during the first anneal the barrier forming elements diffuse to the upper and lower surfaces of the copper containing layers, e.g., the copper containing layer 25 and the seed layer 20 of copper (Cu). For example, a first high concentration barrier forming element region 35a is provided at an interface with the first layer of barrier material 15. The first high concentration barrier forming element region 35a may have a thickness that is less than 20% of the thickness of the copper containing layer 25, as measured from the upper surface of the first layer of barrier material 15. A second high concentration barrier forming element region 35b is provided at an interface of the upper surface of the copper containing layer 25 and the second layer of barrier material 30. The second high concentration barrier forming element region 35b may have a thickness that is less than 20% of the thickness of the copper containing layer 25, as measured from the lower surface of the second layer of barrier material 30. In some embodiments, the barrier forming element, e.g., manganese (Mn), from the seed layer 20 may be present in each of the first and second high concentration barrier forming element regions 35a, 35b in an amount greater than 10 at. %. For example, when the barrier forming element is manganese (Mn), manganese (Mn) may be present in each of the first and second high concentration barrier forming element regions 35a, 35b in an amount ranging from 5 at. % to 20 at. %. In some embodiments, the remainder of the composition for the first and second high concentration barrier forming element regions 35a, 35b may be a metal, such as copper (Cu). In some embodiments, the copper content of the copper containing layer 25 at this stage of the process flow may be greater than 90 at. % copper (Cu).

Figure 3:
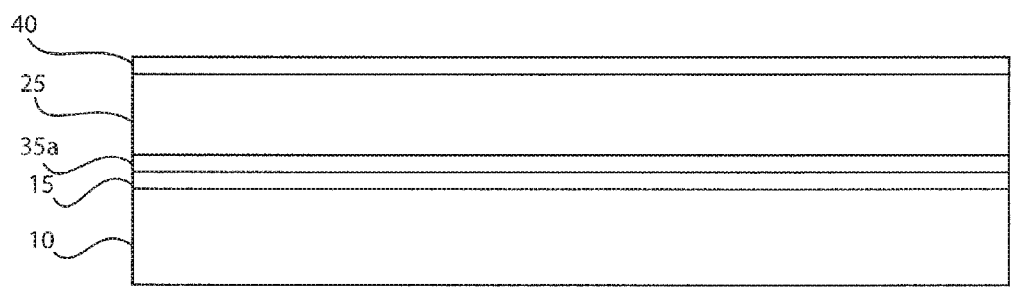
FIG. 3 is a side cross-sectional view depicting thinning the copper containing layer and forming a third layer of barrier material atop the recessed copper containing layer.

FIG. 3 depicts thinning the copper containing layer 25, and forming a third layer of barrier material 40 atop the recessed copper containing layer 25. The copper containing layer 30 may be thinned using a planarizing or etch process. Typically, thinning the copper containing layer 25 also removes the second layer of barrier material 30, as well as the second high concentration barrier forming element regions 35b. Planarization processes suitable for thinning the copper containing layer 25 include chemical mechanical planarization (CMP). In some embodiments, the thickness of the copper containing layer 25 may be reduced by one quarter to three quarters of its original thickness. In some examples, the thickness of the copper containing layer 25 may be reduced to half its original thickness. In some embodiments, the thinning of the copper containing layer 25 is optional.

Figure 4:
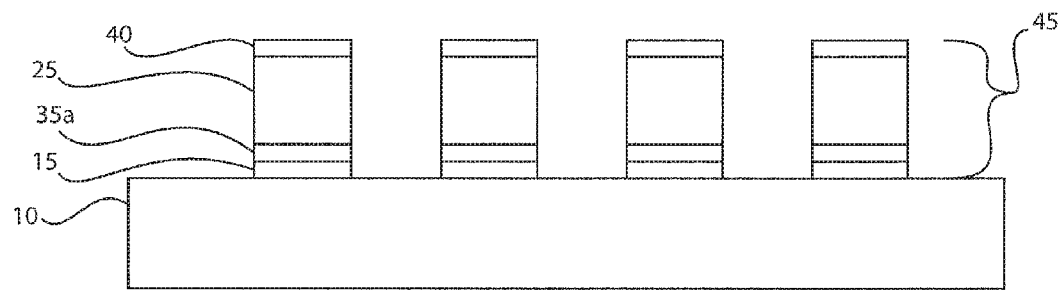
FIG. 4 is a side cross-sectional view depicting one embodiment of etching the structure depicted in FIG. 3 including the copper containing layer to provide a plurality of copper containing lines, in accordance with present disclosure.

FIG. 4 depicts one embodiment of etching the structure depicted in FIG. 3 including the copper containing layer to provide a plurality of copper containing pillars 45. The copper containing pillars 45 may also be referred to as copper containing lines. In some examples, the copper containing lines may also include vias. The plurality of copper containing lines 45 may be formed using a substrate etch process. For example, plurality of copper containing lines 45 may be formed using photolithography, etching and deposition processes. For example, in some embodiments, a pattern (not shown) is produced on the third layer of barrier material 40 by applying a photoresist to the surface to be etched; exposing the photoresist to a pattern of radiation; and then developing the pattern into the photoresist utilizing resist developer. Once the patterning of the photoresist is completed, the sections of the third layer of barrier material 40, as well as the underlying portions of the copper containing layer 35, the first high concentration barrier forming element region 35a, and the first layer of barrier material 15, that are covered by the photoresist are protected while the exposed regions are removed using a selective etching process that removes the unprotected regions. The etch process may be an anisotropic etch, such as reactive ion etch (RIE). The etch process may also be a selective etch process.

Figure 5:
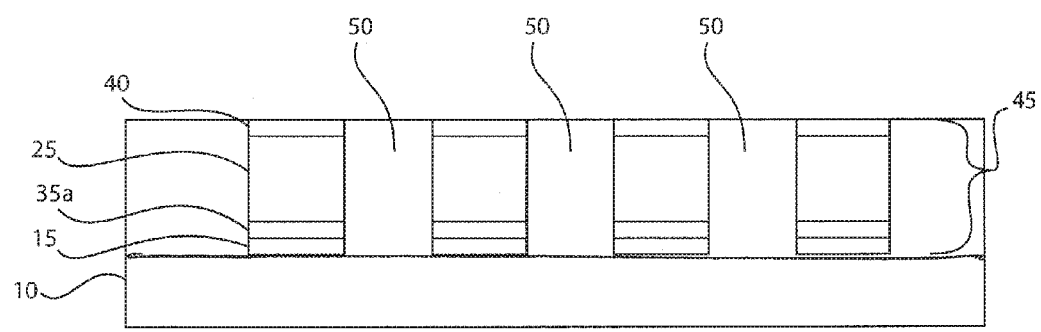
FIG. 5 is a side cross-sectional view depicting one embodiment of depositing a dielectric fill in the space between adjacent copper containing lines.

FIG. 5 depicts one embodiment of depositing a dielectric fill 50 in the space between adjacent copper containing lines 45. The dielectric fill 50 may be composed of any dielectric material, such as an oxide, nitride or oxynitride material. In some embodiments, the dielectric fill may be composed of a low-k dielectric material. The term "low-k" as used to describe a low-k dielectric that can provide a dielectric fill 50 denotes a material having a dielectric constant that is less than silicon dioxide ($SiO_2$) at room temperature (e.g., 25° C.). In one embodiment, the low-k dielectric material has a dielectric constant that is less than 4.0, e.g., 3.9. In another embodiment, the low-k dielectric material may have a dielectric constant ranging from 1.75 to 3.5. In yet another embodiment, the low-k dielectric material may have a dielectric constant ranging from 2.0 to 3.2. In yet an even further embodiment, the low-k dielectric material may have a dielectric constant ranging from 2.25 to 3.0.

Examples of low-k dielectric materials suitable for the dielectric fill 50 include organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ), undoped silica glass, diamond like carbon (DLC), methylsilsesquioxane (MSQ) and combinations thereof. The low-k dielectric material of the dielectric fill 50 may be porous or non-porous. The dielectric fill 50 may be deposited using chemical vapor deposition (CVD), spin on deposition, chemical solution deposition and combinations thereof. Following deposition, a planarization process, such as chemical mechanical planarization (CMP) may be applied to the dielectric fill 50 to provide that the upper surface of the dielectric fill 50 is coplanar with an upper surface of the copper containing lines 45, e.g., the upper surface of the third layer of barrier material 40 is present atop the copper containing layer 25.

In other embodiments, the dielectric fill 50 may include a combination of dielectric films. For example, the dielectric fill 50 may include a first film that can be rich in oxygen to promote the self-forming of the barrier layer. A second dielectric material having a different composition than the first film may then be used to complete the fill. The dielectric fill 50 may also include air gaps. Air gaps can be provided by the deposition of a single or multi-layer dielectric layer, in which the last fill layer has a poor gap fill resulting in the formation of an air gap.

Figure 6:
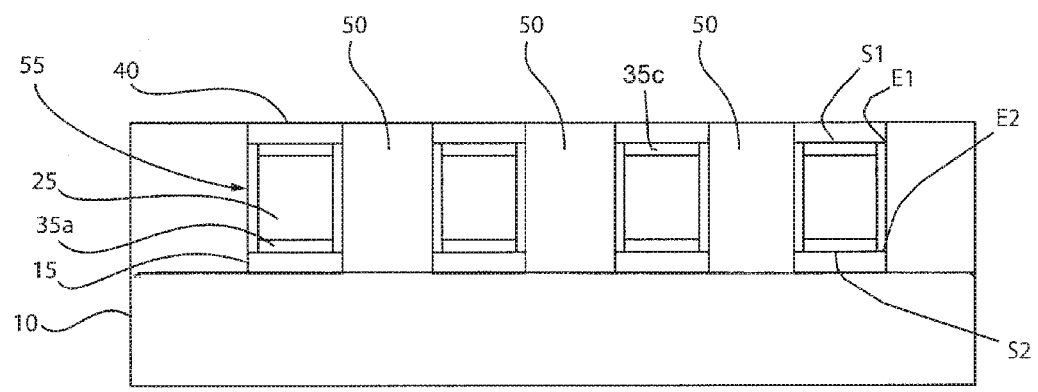
FIG. 6 is a side cross-sectional view depicting a second anneal applied to the plurality of copper containing lines, wherein during the second anneal the barrier forming elements diffuse to an interface between sidewalls of the plurality of the copper containing lines and the dielectric fill to form a barrier layer along the sidewalls of the copper containing lines.

FIG. 6 depicts a second anneal applied to the plurality of copper containing lines 45, wherein during the second anneal the barrier forming elements diffuse to an interface between sidewalls of the plurality of the copper containing lines 45 and the dielectric fill 50 to form a barrier layer 55 along the sidewalls of the copper containing lines 45. The second anneal can also cause the barrier forming element from the barrier layer 20 to diffuse to the upper surfaces of the recessed copper containing layer 25 and form a third high concentration barrier forming element region 35c. The third high concentration barrier forming element region 35c depicted in FIG. 6 is similar to the first high concentration barrier forming element region 35a that is depicted in FIG. 2. Therefore, the above description of the first high concentration barrier forming element region 35a is suitable for the description of the third high concentration barrier forming element region 35c.

In one embodiment, the second anneal may include a temperature that can range from 50° C. to 500° C. In another embodiment, the second anneal may include a temperature that can range from 100° C. to 300° C. The time period of the second anneal process may range from 1 second to 4 hours. In other embodiments, the time period for the second anneal process may range from 10 minutes to 120 minutes. Any annealing apparatus can be used for the second anneal process, such as furnace annealing and rapid thermal annealing (RTA). In one example, the second anneal may be performed in an inert ambient including He, Ar, Ne, Xe, Kr and mixtures thereof. Nitrogen can also be used as an inert ambient alone or in admixture with one of the inert ambients previously mentioned.

In some embodiments, during the second anneal the barrier forming elements 55 can react with oxygen from the dielectric fill 50 to form a barrier layer 55 composed of a metal provided by the barrier forming elements and at least one dielectric forming element from the dielectric fill 50, such as oxygen, e.g., in forming barrier layer 55 of metal oxide. The barrier layer 55 may also be a nitride including nitrogen from the dielectric 50. The barrier layer 55 may also include semiconductor elements, such as silicon (Si), which may also be provided by the dielectric fill 50. For example, in one embodiment when the barrier forming element includes manganese, and the dielectric fill 50 is a carbon doped oxide dielectric comprised of Si, C, O, and H (Si-COH), the barrier layer 55 may be composed of manganese silicon oxide ($MnSiO_3$). More specifically, the manganese diffuses into contact with oxygen (O) and silicon (Si) present in the dielectric fill 50, wherein the manganese and oxygen react to form manganese silicon oxide ($MnSiO_3$). Manganese has a higher affinity for oxygen than copper. In some embodiments, the preferential formation of manganese oxide reduces the formation of copper oxide, therefore reducing the incidence of oxidation of the copper including layer 25.

In the embodiments, in which the barrier forming elements that have diffused to the sidewalls of the copper containing lines 45 during the second anneal include manganese, the manganese that is present in the barrier layer 55 provides an excellent self-forming barrier layer. Manganese that diffuses to the dielectric fill 50 of low-k dielectric material, e.g., SiCOH, can form $MnSi_xO_y$ (dielectric), which is a diffusion barrier to copper. More specifically, the barrier layer 55 may obstruct copper (Cu) from diffusing from the copper including line 45 to the low-k dielectric material 30. The barrier layer 55 can also function as an oxygen getter, copper (Cu) and oxygen (O) diffusion barrier, seed layer and adhesion promoter. It is noted that manganese silicon oxide $MnSi_xO_y$ (dielectric) is only one example of a composition for the barrier layer 55, which may also be referred to as self-forming barrier layer, that is provided by the present disclosure. For example, other compositions for the barrier layer 55 may include $AlSi_xO_y$, $GeSi_xO_y$, $NiSi_xO_y$, $TiSi_xO_y$, and combinations thereof.

The barrier layer 55 is a conformal layer that runs along an entirety of the sidewall of the copper containing layer 25, hereafter referred to as copper containing core 25, of the copper containing lines 45. The term "conformal" denotes a layer having a thickness that does not deviate from 30% of an average value for the thickness of the layer or less. In some embodiments, the barrier layer 55 may have a thickness that does not deviate from 20% of an average value for the thickness of the layer or less. In yet another embodiment, the barrier layer 55 may have a thickness that does not deviate from 10% of an average value for the thickness of the layer or less. In one example, the barrier layer 55 has a thickness at its base that is substantially equal to the thickness of the barrier layer 55 at its upper surface. In one embodiment, the barrier layer 55 may have a thickness ranging from 5 Å to 100 Å. In another embodiment, the barrier layer 55 may have a thickness ranging from 20 Å to 50 Å.

It is further noted that the barrier layer 55 is continuous, i.e., there are no breaks or openings in the material of the barrier layer along the sidewall of the copper containing core 25. The upper surface, i.e., upper edge E1, of the barrier layer 55 is aligned with the upper surface S1 of the copper containing core 25, e.g., the upper surface of the third high concentration barrier forming element region 35c of the copper containing core 25. The lower surface, i.e., lower edge E2, of the barrier layer 55 is aligned with the base surface S2 of the copper containing core 25, e.g., the lower surface of the first high concentration barrier forming region 35a of the copper containing core 25. Because the barrier layer 55 is formed from barrier forming elements that diffuse through the copper containing core 25 to the sidewalls of the dielectric fill 50 the barrier layer is both self-forming and self-aligned. The barrier layer is self-aligned to the copper containing core 25 because it only forms along the sidewalls of the copper containing core 25, at which the barrier forming elements that were originally introduced to the copper containing core 25 by the seed layer 20 alloy with dielectric and/or semiconductor elements from the dielectric fill 50. The copper containing lines 45 including the copper containing core 25 and the self-forming barrier layer 55 can provide for electrically conductive structures for carrying electrical signals, such as lines and vias, in an electrical device.

In one embodiment, the methods that have been described above with reference to FIGS. 1-6 can provide an electrical device that includes a dielectric layer (that can be provided by the dielectric fill 50 depicted in FIG. 6) and at least one electrically conductive structure (that can be provided by the copper containing lines 45 depicted in FIG. 6) within the dielectric layer. Referring to FIG. 6, the at least one electrically conductive structure may include a copper containing core 25 and a barrier layer 55 including manganese, e.g., present on the sidewalls of the copper containing core 25. The barrier layer 55 is present between the copper containing core 25 and the dielectric layer.

In one example, the barrier layer is comprised of manganese, e.g., manganese silicon oxide ($MnSiO_3$). In some embodiments, the barrier layer 55 is a continuous and uniform layer having a lower surface coplanar with a lower surface of the copper containing core 25. The copper containing core 25 can include manganese containing regions, i.e., first and third high concentration barrier forming element regions 35a, 35c, at an upper surface and lower surface of the copper containing core 25. The manganese may be present in these regions alloyed with copper, wherein the manganese content can be as great as 20 at. %. Each of the manganese containing regions, i.e., first and third high concentration barrier forming element regions 35a, 35c, may have a thickness up to 10% of the thickness, i.e., height, of the copper containing core 25. The remainder of the copper containing core 25 between the manganese containing regions, e.g., the barrier layers 55 and first and third high concentration barrier forming element regions 35a, 35c, may comprise greater than 95 at. % copper.

The electrically conductive structure that is depicted in FIG. 6 may be employed in any electrical device. For example, the interconnect structures that are disclosed herein may be present within electrical devices that employ semiconductors that are present within integrated circuit chips. The integrated circuit chips including the disclosed electrically conductive structures, which can serve as vias and/or metal lines, may be integrated with other chips, discrete circuit elements, and/or other signal processing devices as part of either (a) an intermediate product, such as a motherboard, or (b) an end product. The end product can be any product that includes integrated circuit chips, including computer products or devices having a display, a keyboard or other input device, and a central processor.

Having described preferred embodiments of a structures and methods for the SELF-FORMING BARRIER FOR SUBTRACTIVE COPPER it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. An electrical device comprising:
a dielectric layer; and
at least one electrically conductive structure within said dielectric layer, the at least one electrically conductive structure comprising a copper containing core and a barrier layer comprising manganese present on the sidewalls of the copper containing core so that the barrier layer is present between the copper containing core and the dielectric layer, the barrier layer being composed of manganese silicon and oxygen, and being continuous and uniform layer having a lower surface coplanar with a lower surface of the copper containing core, wherein an upper and lower surface of the copper containing core includes alloyed manganese in an amount ranging from 5 at. % to 20 at. % without substantial oxygen and silicon.

2. The electrical device of claim 1, wherein the copper containing core comprises greater than 95 at. % copper.

3. The electrical device of claim 1, wherein the barrier layer has an upper surface coplanar with an upper surface of the copper containing core.

4. The electrical device of claim 1, wherein the copper containing core includes an upper manganese containing regions at an upper surface of the copper containing core.

5. The electrical device of claim 1, wherein the copper containing core includes a lower manganese containing regions at a lower surface of the copper containing core.

6. The electrical device of claim 1, wherein the barrier layer comprises manganese silicon oxide ($MnSiO_3$).

7. The electrical device of claim 1, wherein the barrier layer comprises manganese nitride that is selected from a group consisting of $Mn_4N$, $Mn_2N$, $Mn_3N$ and combinations thereof.

8. The electrical device of claim 1, wherein the copper containing core comprises a grain size that ranges from 350 nm to 3000 nm.

9. An electrical device comprising:
a dielectric layer; and
at least one electrically conductive structure within said dielectric layer, the at least one electrically conductive structure comprising a copper containing core and a barrier layer comprising manganese silicon oxide ($MnSiO_3$) present on the sidewalls of the copper containing core so that the barrier layer is present between the copper containing core and the dielectric layer, the barrier layer being continuous and uniform layer having a lower surface coplanar with a lower surface of the copper containing core, wherein an upper and lower surface of the copper containing core includes alloyed manganese in an amount ranging from 5 at. % to 20 at. % without substantial oxygen and silicon.

10. The electrical device of claim 9, wherein the copper containing core comprises greater than 95 at. % copper.

11. The electrical device of claim 9, wherein the barrier layer has an upper surface coplanar with an upper surface of the copper containing core.

12. The electrical device of claim 9, wherein the copper containing core comprises a grain size that ranges from 350 nm to 3000 nm.

* * * * *